(12) United States Patent
Le et al.

(10) Patent No.: US 10,096,709 B2
(45) Date of Patent: Oct. 9, 2018

(54) ASPECT RATIO TRAPPING (ART) FOR FABRICATING VERTICAL SEMICONDUCTOR DEVICES

(71) Applicant: Intel Corporation, Santa Clara, CA (US)

(72) Inventors: Van H. Le, Portland, OR (US); Benjamin Chu-Kung, Portland, OR (US); Gilbert Dewey, Hillsboro, OR (US); Jack T. Kavalieros, Portland, OR (US); Ravi Pillarisetty, Portland, OR (US); Willy Rachmady, Beaverton, OR (US); Marko Radosavljevic, Beaverton, OR (US); Matthew V. Metz, Portland, OR (US); Niloy Mukherjee, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/119,345

(22) PCT Filed: Mar. 28, 2014

(86) PCT No.: PCT/US2014/032203
§ 371 (c)(1),
(2) Date: Aug. 16, 2016

(87) PCT Pub. No.: WO2015/147865
PCT Pub. Date: Oct. 1, 2015

(65) Prior Publication Data
US 2017/0012125 A1    Jan. 12, 2017

(51) Int. Cl.
*H01L 29/78* (2006.01)
*H01L 29/423* (2006.01)
(Continued)

(52) U.S. Cl.
CPC .. *H01L 29/7848* (2013.01); *H01L 21/823807* (2013.01); *H01L 21/823885* (2013.01);
(Continued)

(58) Field of Classification Search
None
See application file for complete search history.

(56) References Cited

U.S. PATENT DOCUMENTS 6,660,590 B2 * 12/2003 Yoo ..................... H01L 29/7827
                                                    257/E21.41
7,205,604 B2 *  4/2007 Ouyang ............. H01L 29/1054
                                                    257/302
(Continued)

FOREIGN PATENT DOCUMENTS

JP      2006245267       9/2006
TW      200411928        7/2004
(Continued)

OTHER PUBLICATIONS

Non-Final Office Action for Taiwan Patent Application No. 104103725 dated Jul. 21, 2016, 8 pgs.
(Continued)

*Primary Examiner* — Telly Green
(74) *Attorney, Agent, or Firm* — Schwabe, Williamson & Wyatt, P.C.

(57) ABSTRACT

Aspect ratio trapping (ART) approaches for fabricating vertical semiconductor devices and vertical semiconductor devices fabricated there from are described. For example, a semiconductor device includes a substrate with an uppermost surface having a first lattice constant. A first source/drain region is disposed on the uppermost surface of the substrate and has a second, different, lattice constant. A vertical channel region is disposed on the first source/drain region. A second source/drain region is disposed on the
(Continued)

vertical channel region. A gate stack is disposed on and completely surrounds a portion of the vertical channel region.

25 Claims, 6 Drawing Sheets

(51) Int. Cl.
*H01L 29/66* (2006.01)
*H01L 29/786* (2006.01)
*H01L 21/8238* (2006.01)
*H01L 29/267* (2006.01)
*H01L 29/08* (2006.01)
*H01L 29/165* (2006.01)
*H01L 29/739* (2006.01)

(52) U.S. Cl.
CPC ........ *H01L 29/0847* (2013.01); *H01L 29/165* (2013.01); *H01L 29/267* (2013.01); *H01L 29/42392* (2013.01); *H01L 29/66356* (2013.01); *H01L 29/66666* (2013.01); *H01L 29/66977* (2013.01); *H01L 29/7391* (2013.01); *H01L 29/7827* (2013.01); *H01L 29/78618* (2013.01); *H01L 29/78642* (2013.01); *H01L 29/78696* (2013.01)

(56) References Cited

U.S. PATENT DOCUMENTS

| | | | | |
|---|---|---|---|---|
| 7,915,685 | B2* | 3/2011 | Cohen | H01L 21/823412 257/365 |
| 8,759,906 | B2* | 6/2014 | Sung | H01L 27/10876 257/329 |
| 8,987,794 | B2* | 3/2015 | Rachmady | H01L 29/42392 257/288 |
| 9,099,433 | B2* | 8/2015 | Green | H01L 29/402 |
| 2003/0122187 | A1* | 7/2003 | Yoo | H01L 29/7827 257/328 |
| 2004/0157353 | A1* | 8/2004 | Ouyang | H01L 29/1054 438/38 |
| 2006/0278921 | A1 | 12/2006 | Pellizzer et al. | |
| 2007/0148939 | A1 | 6/2007 | Chu et al. | |
| 2008/0061316 | A1 | 3/2008 | Cohen | |
| 2008/0067607 | A1 | 3/2008 | Verhulst et al. | |
| 2009/0236656 | A1* | 9/2009 | Sung | H01L 27/10876 257/329 |
| 2010/0032739 | A1* | 2/2010 | Lindholm | H01L 27/0207 257/296 |
| 2012/0012932 | A1* | 1/2012 | Perng | H01L 29/165 257/347 |
| 2013/0277680 | A1* | 10/2013 | Green | H01L 29/402 257/76 |
| 2014/0030859 | A1 | 1/2014 | Xie et al. | |
| 2014/0054658 | A1 | 2/2014 | Ma et al. | |
| 2014/0225065 | A1* | 8/2014 | Rachmady | H01L 29/42392 257/24 |
| 2014/0252458 | A1* | 9/2014 | Sung | H01L 27/10876 257/329 |
| 2015/0295075 | A1* | 10/2015 | Green | H01L 29/402 257/76 |

FOREIGN PATENT DOCUMENTS

| | | |
|---|---|---|
| TW | 200511521 | 3/2005 |
| WO | WO 2008/039534 | 4/2008 |
| WO | WO-2013095651 | 6/2013 |

OTHER PUBLICATIONS

International Search Report and Written Opinion for PCT Patent Application No. PCT/US2014/032203 dated Dec. 22, 2014, 12 pgs.
International Preliminary Report or Patentability for PCT Patent Application No. PCT/US2014/032203 dated Oct. 13, 2016, 9 pgs.
Search Report from European Patent App No. 14887278.1 dated Oct. 27, 2017, 9 pages.
Office Action and Search Report for Taiwan Patent Application No. 106100480 dated Jul. 6, 2017, 14 pages.
Notice of Allowance for Taiwan Patent Application No. 104103725 dated Dec. 7, 2016, 2 pages.
Notice of Allowance for Taiwan Patent Application No. 106100480 dated Nov. 16, 2017, 2 pages.

* cited by examiner

ASPECT RATIO TRAPPING (ART) FOR FABRICATING VERTICAL SEMICONDUCTOR DEVICES

CLAIM OF PRIORITY

This application is a U.S. National Phase application under 35 U.S.C. § 371 of International Application No. PCT/US2014/032203, filed Mar. 28, 2014, entitled "ASPECT RATIO TRAPPING (ART) FOR FABRICATING VERTICAL SEMICONDUCTOR DEVICES," the entire contents of which are incorporated herein by reference.

TECHNICAL FIELD

Embodiments of the invention are in the field of semiconductor devices and, in particular, aspect ratio trapping (ART) approaches for fabricating vertical semiconductor devices and vertical semiconductor devices fabricated there from.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, or gate-all-around devices, such as nanowires, have become more prevalent as device dimensions continue to scale down. Many different techniques have been attempted to reduce channel or external resistance of such transistors. However, significant improvements are still needed in the area of channel or external resistance suppression.

Additionally, many different techniques have been attempted to manufacture devices with non-Si channel materials such as SiGe, Ge, and III-V materials. However, significant process improvements are still needed to integrate these materials onto Si wafers.

Furthermore, maintaining mobility improvement and short channel control as microelectronic device dimensions scale past the 15 nanometer (nm) node provides a challenge in device fabrication. Nanowires used to fabricate devices provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example). Many different techniques have been attempted to improve the mobility of transistors. However, significant improvements are still needed in the area of electron and/or hole mobility improvement for semiconductor devices.

BRIEF DESCRIPTION OF THE DRAWINGS

FIG. 1A illustrates a cross-sectional view of a semiconductor structure following drain and vertical channel region formation through aspect ratio trapping;

FIG. 1B illustrates a cross-sectional view of the semiconductor structure of FIG. 1A following source region formation;

FIG. 1C illustrates a cross-sectional view of the semiconductor structure of FIG. 1B following isolation recess;

FIG. 1D illustrates a cross-sectional view of the semiconductor structure of FIG. 1C following gate stack formation;

FIG. 1E illustrates a cross-sectional view and corresponding plan view of the semiconductor structure of FIG. 1D following gate stack patterning;

FIG. 1F illustrates a cross-sectional view of the semiconductor structure of FIG. 1E following second isolation formation;

FIG. 1G illustrates a cross-sectional view of the semiconductor structure of FIG. 1F following second isolation recess and source region re-exposure;

FIG. 1H illustrates a cross-sectional view of the semiconductor structure of FIG. 1G following gate stack recess;

FIG. 1I illustrates a cross-sectional view of the semiconductor structure of FIG. 1H following source contact formation; and FIG. 1J illustrates a cross-sectional view of the semiconductor structure of FIG. 1I following drain contact and gate contact formation.

DESCRIPTION OF THE EMBODIMENTS

Figure 1A:
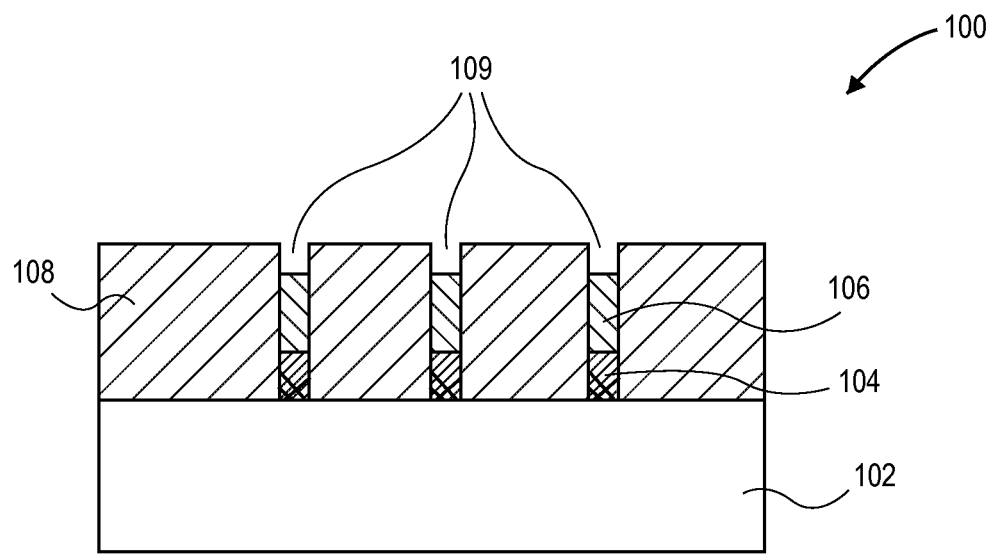
FIGS. 1A-1J illustrate various operations in a method of fabricating a vertical semiconductor device using aspect ratio trapping (ART), in accordance with an embodiment of the present invention, where.

Aspect ratio trapping (ART) approaches for fabricating vertical semiconductor devices and vertical semiconductor devices fabricated there from are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to implementations of aspect ratio trapping of non-lattice-matched materials on silicon for vertical device fabrication, such as for metal oxide semiconductor field effect transistor (MOS-FET) or tunneling field effect transistor (TFET) fabrication. One or more embodiments may be applicable for high performance, low leakage logic complementary metal oxide semiconductor (CMOS) devices. In one embodiment, aspect ratio trapping is used to achieve defect reduction in the semiconductor materials used to fabricate vertical devices. Embodiments may be applicable to vertical devices, compound semiconductor (III thru V) devices, MOS\CMOS applications, etc. In one embodiment, a vertical device is defined as one having one source/drain region oriented above another source/drain region, with a channel region running perpendicularly, between the two regions, with respect to an underlying substrate surface.

To provide context, transistors traditionally are built in the horizontal plane of silicon (Si) wafers. Embodiments described herein are directed to the fabrication of transistors of mismatched materials on Si inside aspect ratio trenches to enable defect trapping in a lowermost portion of a device layer in a vertical device architecture. Such defect trapping may enable good device performance, while the vertical device architecture may enable gate length (Lg) scaling and/or leakage reduction.

More generally, embodiments described herein involve implementation of aspect ratio trapping (ART) by forming openings or trenches in an insulating layer formed on a silicon substrate (or other) surface. Non-latticed matched materials for vertical transistors are then grown directly on portions of the substrate exposed by the openings. Aspect ratio trapping may be implemented for a variety of purposes such as, but not limited to, (1) defect reduction in mismatched materials for successful integration onto Si, and (2) enabling vertical device architectures that allows for gate length (Lg) scaling and leakage reduction. The unifying combination of these two advantages is a new outcome achievable by ART approaches described herein. Thus, embodiments may be used to achieve one or more of, (a) using ART openings or trenches to grow films while trapping defects, (b) growing doped source/drain (S/D) materials at opening or trench bottoms to trap defects in the S/D materials, (c) upon such defect confinement or capture, an intrinsic channel material may be grown, and (d) a top layer may then be grown to form another contact which may be grown to the top of the opening and then laterally expanded.

More specifically, embodiments described herein involve implementation of ART for the fabrication of vertical field effect transistors (FETs) for non-lattice matched materials on silicon (Si) substrates. In an exemplary embodiment, a vertical FET is fabricated by employing ART trenches to grow films while trapping defects within a targeted one of the films. For example, a doped S/D material can be grown at a trench bottom (on an exposed portion of a silicon substrate) with defects trapped therein. Upon defect capture, the channel material is grown. Following subsequent fabrication of an upper source/drain region and a gate electrode, a vertical silicon substrate/drain/channel (intrinsic)/source (D/I/S) or vertical silicon substrate/source/channel (intrinsic)/drain (S/I/D) device is formed. In one such embodiment, the source and drain regions have the same conductivity type. In another embodiment, however, a P-type tunnel field effect transistor (PTFET) is fabricated wherein the material stack is Si substrate/P/I/N. In yet another embodiment, an N-type tunnel field effect transistor (NTFET) is fabricated wherein the material stack is Si substrate/N/I/P.

In accordance with one or more embodiments described herein, advantages of approaches described herein include one or more of, but are not limited by, the use of ART to reduce defects in a channel region and to allow direct integration of III-V, and IV materials on Si; facilitation of co-integration of N/P type vertical FETs onto Si; and vertical architecture fabrication to enable Lg scaling as defined by an epitaxy film thickness instead of being defined by lithography. Embodiments of the present invention can be implemented to enable CMOS integration of high performing, group III-V, IV materials onto Si in the form of vertical transistors. In an embodiment, a potential secondary effect can be derived in cases where the source or drain, or both, is not lattice-matched to the channel, providing for a strain-inducing effect to the channel region. Such a strain-induced channel region may exhibit increased mobility.

Thus, one or more embodiments described herein enable fabrication of a vertical device through aspect ratio trapping. In an exemplary process flow, FIGS. 1A-1J illustrate various operations in a method of fabricating a vertical semiconductor device using aspect ratio trapping (ART), in accordance with an embodiment of the present invention.

FIG. 1A illustrates a cross-sectional view of a starting point semiconductor structure 100 following drain region 104 and vertical channel region 106 formation above a substrate 102 through aspect ratio trapping. In an embodiment, an isolation layer 108 is first formed over the substrate 102 and planarized. The isolation layer 108 may be referred to as a shallow trench isolation (STI) layer since it can ultimately be used to isolate neighboring devices from one another. Such an STI layer may be formed by a deposition and chemical mechanical polishing (CMP) process.

Referring again to FIG. 1A, openings 109 are then formed in isolation layer 108, e.g., by a lithography and etch process. The openings 109 expose portions of the uppermost surface 102. Drain region 104 is then epitaxially grown on the exposed portion of the substrate 102. However, the growth of drain region 104 is confined by the opening(s) 109 and, thus, the aspect ratio of the drain region 104 may be trapped. Furthermore, in an embodiment, and as labeled as 105 in FIG. 1B, the drain region 104 includes lattice defects therein. In one such embodiment, the lattice defects arise since the drain region 104 is lattice mismatched from the substrate 102. In an embodiment, the defects are effectively confined to the drain region 104 and, thus, are not propagated to additional layers formed thereon. Subsequently, the vertical channel region 106 is grown vertically from drain region 104, e.g., by an epitaxial deposition process. In an embodiment, the vertical channel region 106 is essentially defect-free since the defects 105 were not propagated from drain region 104. Furthermore, like the drain region 104, the growth of the vertical channel region 106 is confined by the opening(s) 109 and, thus, the aspect ratio of the vertical channel region 106 may also be trapped.

With reference again to FIG. 1A, it is to be appreciated that three openings 109 are shown for illustrative purposes, showing three vertical channel regions 106 formed. An ultimately formed semiconductor device may include one or more vertical channel regions. It is also to be appreciated that the drain region 104 which is described herein as the lower contact region of a vertical channel region 106 can instead be a source region. That is, an ultimately fabricated device may have a lower drain region, vertical channel region and upper source region, or may have a lower source region, vertical channel region and upper drain region.

In an embodiment, substrate 102 is composed of a semiconductor material that can withstand a manufacturing process while being compatible with materials deposited or epitaxially grown thereon. In an embodiment, substrate 102 is composed of a bulk crystalline silicon, silicon/germanium or germanium layer and may be doped. In one embodiment, the concentration of silicon atoms in bulk substrate 102 is greater than 97%. In another embodiment, substrate 102 is composed of an epitaxial layer grown atop a distinct crystalline substrate, e.g. a silicon epitaxial layer grown atop a boron-doped bulk silicon mono-crystalline substrate. Substrate 102 may alternatively be composed of a group III-V material. In an embodiment, substrate 102 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In other embodiments, substrate 102 includes an intervening insulating layer, such as in the case of a silicon-on-insulator (SOI) substrate.

In an embodiment, the isolation layer 108 (also referred to herein as an insulator layer) is composed of a material suitable to ultimately electrically isolate, or contribute to the isolation of, adjacent devices. For example, in one embodiment, the isolation layer 108 is composed of a dielectric material such as, but not limited to, silicon dioxide, silicon oxy-nitride, silicon nitride, or carbon-doped silicon nitride. In an embodiment, the openings 109 formed in the isolation layer, and exposing portions of the substrate 102, are formed by a lithography and etch process.

In an embodiment, each of the openings 109 is patterned to have a shape (from a top view perspective) that is one of a square shape, a rectangular shape, a circular shape, or an oval shape. Other geometries may be suitable as well. In one embodiment, from a top view perspective, the width and length of each of the openings 109 are approximately the same (e.g., as in the case for a square shape of circular shape), however, they need not be (as in the case for a rectangular or oval shape), again as viewed from a top view perspective.

In an embodiment, the drain region(s) 104 is formed on exposed portions of substrate 102 by a deposition process such as, but not limited to, chemical vapor deposition (CVD), atomic layer deposition (ALD), or molecular beam epitaxy (MBE). In an embodiment, the drain region 104 is in situ doped with impurity atoms. In one embodiment, the drain region 104 is doped with impurity atoms subsequent to formation. In one embodiment, the drain region 104 is in situ doped with impurity atoms and further doped subsequent to formation. It is to be appreciated that the drain region 104 may be composed of a like or different semiconductor material as that of the semiconductor material of substrate 102. In one embodiment, the drain region 104 is composed of a crystalline silicon, silicon/germanium, germanium or germanium tin (GeSn) layer, which may be doped with a charge carrier, such as but not limited to, phosphorus, arsenic, boron or a combination thereof. In another embodiment, the drain region 104 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof, which may be doped with a charge carrier, such as but not limited to, carbon, silicon, germanium, oxygen, sulfur, selenium or tellurium.

In an embodiment, the vertical channel region(s) 106 is formed on the drain region 102 by a deposition process such as, but not limited to, chemical vapor deposition (CVD), atomic layer deposition (ALD), or molecular beam epitaxy (MBE). It is to be appreciated that the vertical channel region 106 may be composed of a like or different semiconductor material as that of the semiconductor material of the drain region 104. In one embodiment, the vertical channel region 106 is composed of a crystalline silicon, silicon/germanium, germanium or germanium tin (GeSn) layer. In another embodiment, the vertical channel region 206 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In an embodiment, the vertical channel region is not doped (intrinsic) or is only lightly doped.

In a particular embodiment, the vertical channel region 106 is composed essentially of silicon, is pure silicon, or is essentially pure silicon. The terms composed essentially of silicon, pure silicon or essentially pure silicon may be used to describe a silicon material composed of a very substantial amount of, if not all, silicon. However, it is to be understood that, practically, 100% pure silicon may be difficult to form in the presence of other material such as silicon germanium and, hence, could include a tiny percentage of Ge or other species. The Ge or other species may be included as an unavoidable impurity or component during deposition of Si or may "contaminate" the Si upon diffusion during post deposition processing. As such, embodiments described herein directed to a Si channel portion may include Si channel portions that contain a relatively small amount, e.g., "impurity" level, non-Si atoms or species, such as Ge. By contrast, regions such as a regrown source region may include a significant amount of germanium, e.g., in the form of a silicon germanium layer.

Figure 1B:
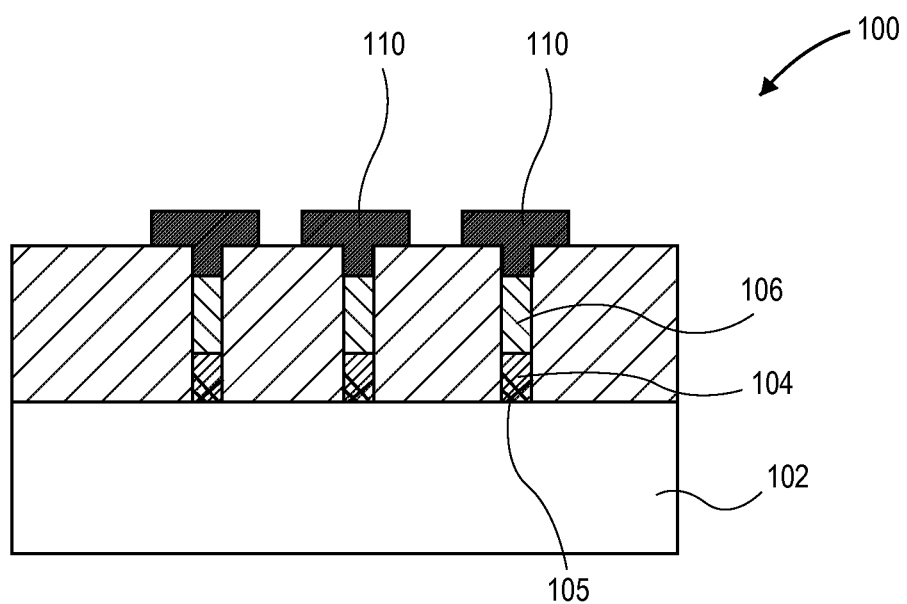

FIG. 1B illustrates a cross-sectional view of the structure of FIG. 1A following source region formation. In accordance with an embodiment of the present invention, a source region 110 is formed on the uppermost, exposed surface of the vertical channel region 106. In one embodiment, as depicted, the uppermost surface of the vertical channel region 106 is below the height of the STI layer 108. As such, at least a lower portion of the source region is confined by the opening(s) 109 and, thus, the aspect ratio of the source region 110 may be trapped. In one embodiment, a second portion of the source region is formed above and expands over a portion of the STI layer 108, as is also depicted in FIG. 1B. Nonetheless, it is to be appreciated that, in one embodiment, epitaxial formation of the source region 110 is selective in that the growth only occurs on/from the vertical channel region 106 and does not initiate on the STI layer 108.

In an embodiment, the source region(s) 110 is formed on vertical channel region 106 by a deposition process such as, but not limited to, chemical vapor deposition (CVD), atomic layer deposition (ALD), or molecular beam epitaxy (MBE). In one embodiment, the source region 110 is in situ doped with impurity atoms. In one embodiment, the source region 110 is doped with impurity atoms subsequent to formation. In one embodiment, the source region 110 is in situ doped with impurity atoms and further doped subsequent to formation. It is to be appreciated that the source region 110 may be composed of a like or different semiconductor material as that of the vertical channel region 110. In one embodiment, the source region 110 is composed of a crystalline silicon, silicon/germanium, germanium, or germanium tin layer, which may be doped with a charge carrier, such as but not limited to, phosphorus, arsenic, boron or a combination thereof. In another embodiment, the source region 110 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof, which may be doped with a charge carrier, such as but not limited to, carbon, silicon, germanium, oxygen, sulfur, selenium or tellurium.

As mentioned briefly above, the source region 110, the drain region 104, or both may be fabricated to impart strain to the vertical channel region 106. In an embodiment, the vertical channel region 106 is a uniaxially strained vertical channel region with the strain along the channel in a direction vertical to the substrate 102 surface, i.e., running between source and drain regions. Such a uniaxially strained vertical channel region 106 may be uniaxially strained with tensile strain or with compressive strain, e.g., for NMOS or PMOS, respectively. In one embodiment, the lattice constant of the source region 110, the drain region 104, or both, is smaller than the lattice constant of the vertical channel region 106, and the source region 110, the drain region 104, or both, imparts a compressive uniaxial strain to the vertical channel region 106. In another embodiment, the lattice constant of the source region 110, the drain region 104, or both, is larger than the lattice constant of the vertical channel region 106, and the source region 110, the drain region 104, or both, imparts a tensile uniaxial strain to the vertical channel region 106. In one embodiment, the vertical channel region 106 is composed of $Si_xGe_{1-x}$, and the source region 110, the drain region 104, or both, is composed of $Si_yGe_{1-y}$ where $0 \le x, y \le 1$ and $x \ne y$. In another embodiment, the vertical channel region 106 is composed of $Al_xGa_{1-x}As$, $In_xGa_{1-x}As$, $In_xGa_{1-x}P$ or $Al_xIn_{1-x}Sb$, and the source region 110, the drain region 104, or both, is composed of $Al_yGa_{1-y}As$, $In_yGa_{1-y}As$, $In_yGa_{1-y}P$ or $Al_yIn_{1-y}Sb$, respectively, where $0 \le x, y \le 1$ and $x \ne y$.

Figure 1C:
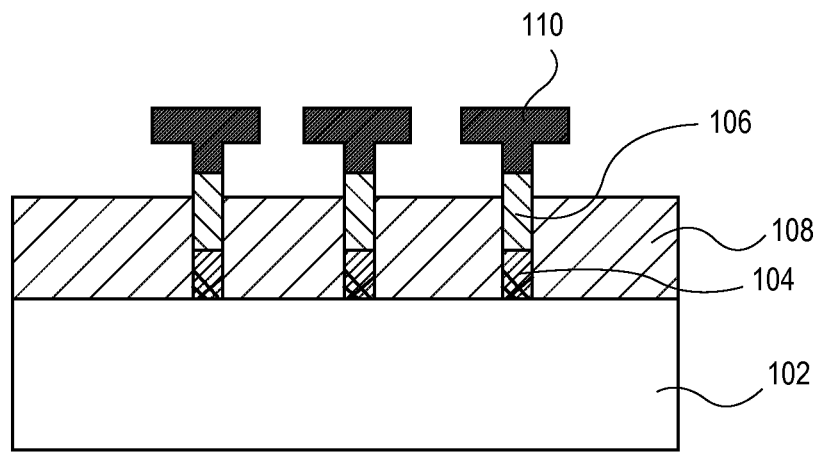

FIG. 1C illustrates a cross-sectional view of the structure of FIG. 1B following isolation recess. In an embodiment, a portion, but not all, of the STI layer 108 is recessed to expose a portion of the vertical channel region 106. The recessing represents initiation of the gate electrode formation process which is elaborated on below, in accordance with FIGS. 1D and 1E. In one embodiment, a wet etch based on aqueous hydrofluoric acid is used to recess the STI layer 108. However, dry etch processing may be used instead of, or in conjunction with, such a wet etch process. It is to be appreciated that, in accordance with one embodiment, FIG. 1C depicts an extent of recess suitable for a vertical TFET. In another embodiment, for a MOSFET, the recess is performed to an extent that the gate stack can surround essentially the entire channel and equidistant to both the S/D, whereas the TFET would have the gate stack over the source/channel region, away from the drain side.

Figure 1D:
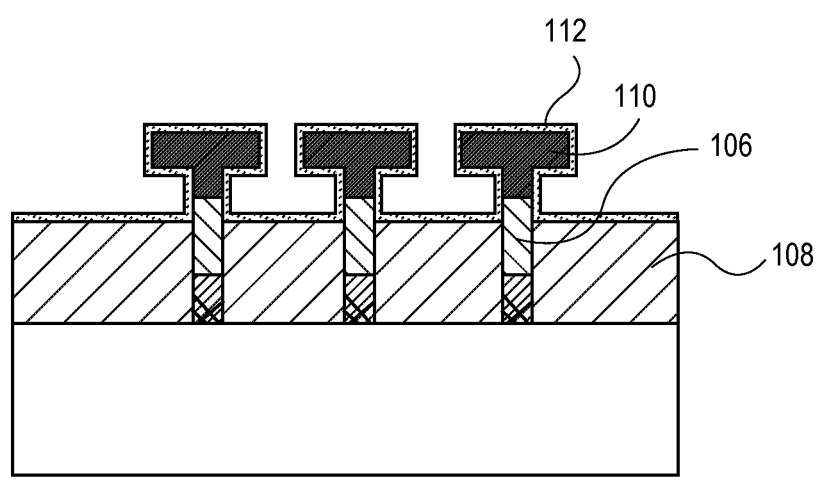

FIG. 1D illustrates a cross-sectional view of the structure of FIG. 1C following gate stack formation. In an embodiment, a gate dielectric layer and gate electrode layer (shown combined as stack 112) is formed on the entire structure of FIG. 1C. Most importantly, the gate stack 112 is formed on all surfaces of the vertical channel region 106 exposed during STI layer 108 recess. Consequentially, in one embodiment, the gate stack 112 is also formed on all exposed surfaces of the source region 110, as is depicted in FIG. 1D. In one embodiment, the layers of the gate stack 112 are formed by atomic layer deposition (ALD) and/or chemical vapor deposition (CVD) and are thus conformal with the structure of FIG. 1C, as is also depicted in FIG. 1D.

In accordance with an embodiment of the present invention, gate stack 112 includes a metal gate electrode and a high-K gate dielectric layer. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the outermost few layers of the vertical channel region 106. In an embodiment, the gate dielectric layer is composed of an outermost high-k portion and an inner portion composed of an oxide of a semiconductor material. In one embodiment, the gate dielectric layer is composed of an outermost portion of hafnium oxide and an inner portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed to surround a metal workfunction-setting layer disposed around the gate dielectric layer.

Figure 1E:
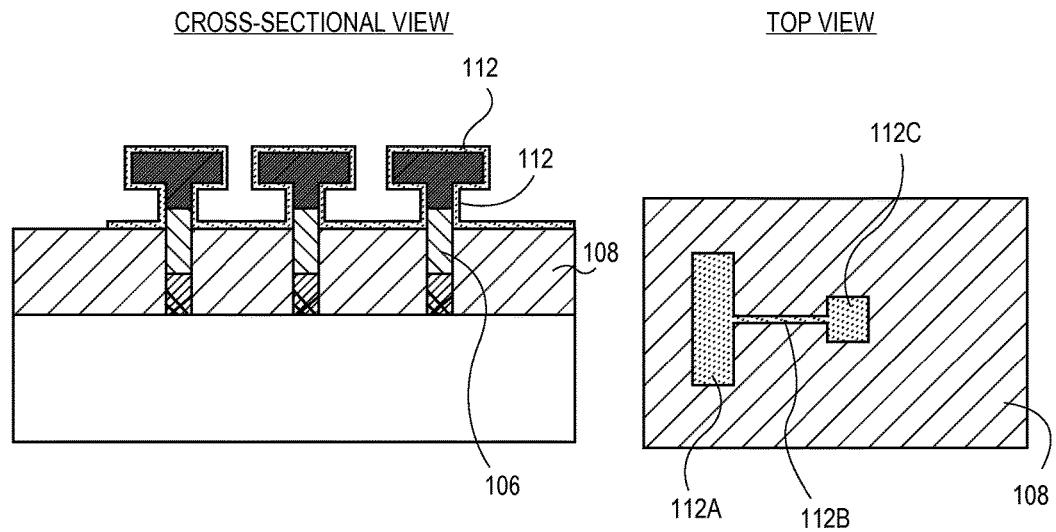

FIG. 1E illustrates a cross-sectional view and corresponding plan view of the structure of FIG. 1D following gate stack 112 patterning. In an embodiment, since the gate stack 112 was formed conformally and without selectivity to different surfaces, the gate stack 112 is patterned, e.g., by a lithography and etch process. In one such embodiment, the gate stack 112 is patterned to leave a portion of the gate stack on the exposed portions of the vertical channel region 106 and the source region 110, and to leave a portion along the surface of the STI layer 108 for ultimate gate contact formation. For example, as seen from the top view, portion 112A of the patterned gate stack 112 is the portion on the source region 110, portion 112C provides a location for later gate contact/via landing, and portion 112B is a line coupling the portions 112A and 112B. In one embodiment, the gate stack 112 is patterned by a dry etch process, wet etch process, or combination thereof, suitable to pattern the layers of the gate stack 112 without significantly impacting the STI layer 108. In an embodiment, subsequent to patterning the gate stack 112, a portion of the gate stack 112 completely surrounds at least a portion of each of the vertical channel regions 106. As mentioned briefly above, an ultimately fabricated device may be based on one or more vertical channel regions, with the specific example depicted based on three vertical channel regions.

Figure 1F:
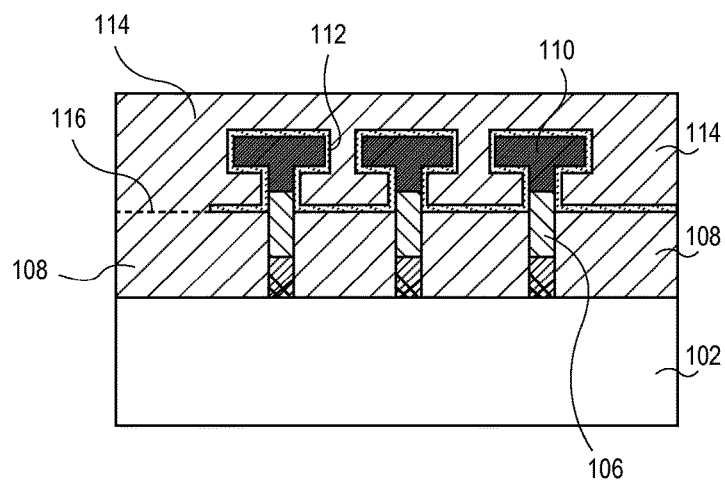

FIG. 1F illustrates a cross-sectional view of the structure of FIG. 1E following second isolation formation. In an embodiment, a second isolation layer 114 is formed to cover the source regions 110. In one such embodiment, the second isolation layer is composed of the same material as the STI layer 108, and the layers are essentially indiscernible from one another. However, in other embodiments, a seam 116 is observable between layers 108 and 114, as is depicted, as depicted in FIG. 1F. The second isolation layer may be formed by a deposition process, such as a CVD process, and may be planarized, e.g., by a CMP process. In any case, the second isolation layer can effectively be implemented as a shallow trench isolation structure for isolating devices from one another.

Figure 1G:
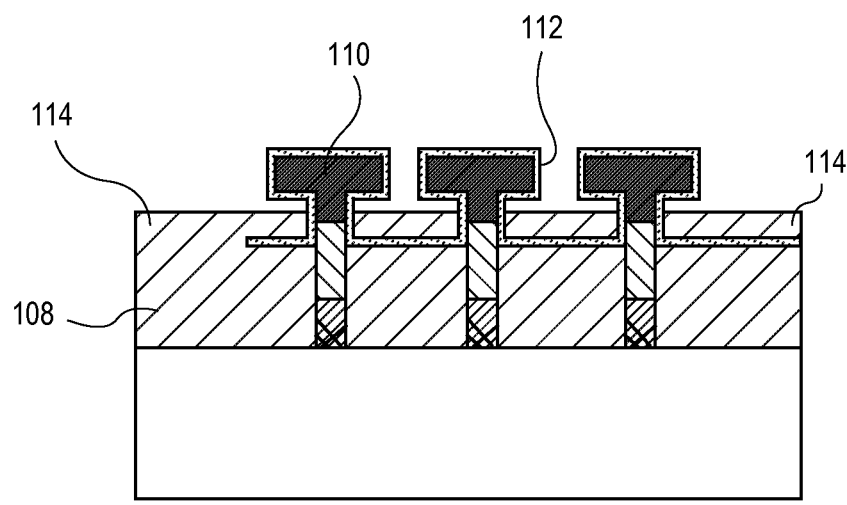

FIG. 1G illustrates a cross-sectional view of the structure of FIG. 1F following second isolation layer 114 recess and source region 110 re-exposure. In an embodiment, a portion, but not all, of the second isolation layer 114 is recessed to expose at least a portion of the source region 110. In one embodiment, the second isolation layer 114 is recessed to a level below the widest portion of the source region 110, as is depicted in FIG. 1G. In one embodiment, a wet etch is used to recess the second isolation layer 114. However, dry etch processing may be used instead of, or in conjunction with, such a wet etch process.

Figure 1H:
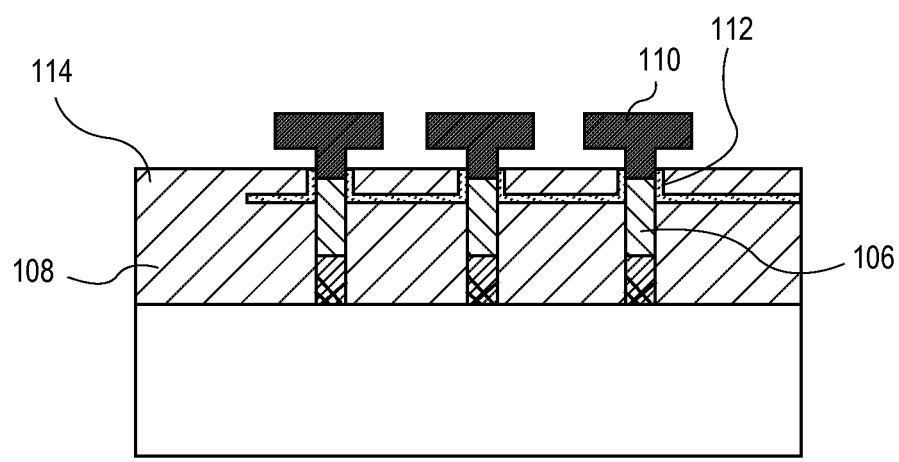

FIG. 1H illustrates a cross-sectional view of the semiconductor structure of FIG. 1G following gate stack recess. In an embodiment, exposed portions of the gate stack 112 are removed from the source region 110. By removing these portions of the gate stack 112, the surface of the source region 110 that protrudes above the second isolation layer 114 is not covered by gate stack 112 material, as is depicted in FIG. 1H. In one embodiment, a wet etch is used to remove the exposed portions of the gate stack 112. However, dry etch processing may be used instead of, or in conjunction with, such a wet etch process. Following recess of gate stack, a third isolation layer 117 may be added (e.g., by deposition an etch back) to expose only upper portions of source regions 110, as depicted in FIG. 1I, described below.

Figure 1I:
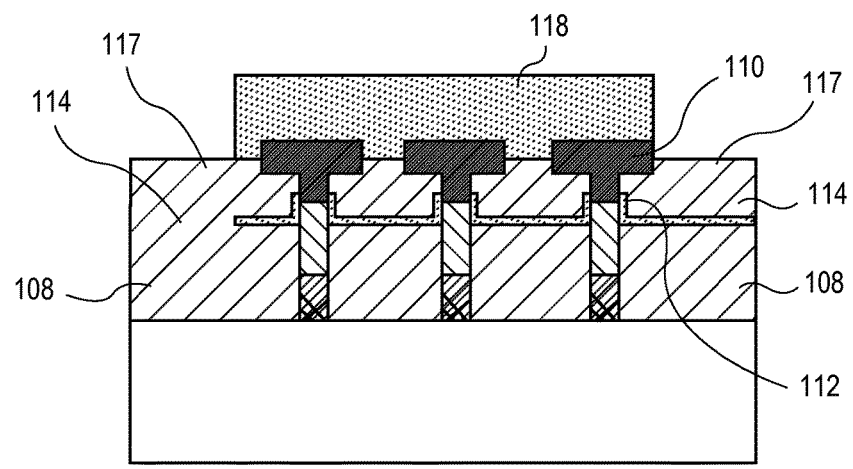

FIG. 1I illustrates a cross-sectional view of the structure of FIG. 1H following source contact formation. In an embodiment, a source contact 118 is formed to cover substantially all of the portions of source region 110 protruding above the third isolation layer 117. In one embodiment, the source contact 118 is formed by a subtractive deposition and etch process. In another embodiment, the material of source contact 118 is formed by selective growth on the portion of source regions 110 protruding above the third isolation layer 117. It is to be appreciated that the specific depiction of a commons source contact for three source regions is for one particular embodiment. Other groupings of one or more source regions with a common source contact are also considered within the spirit and scope of embodiments of the present invention.

In an embodiment, source contact 118 is composed of a conductive material. In one such embodiment, source contact 118 is composed of a metal or metallic material. The metal or metallic material may be a pure metal, such as tungsten, nickel, or cobalt, or may be an alloy such as a metal-metal alloy or a metal-semiconductor alloy (e.g., such as a silicide material).

Figure 1J:
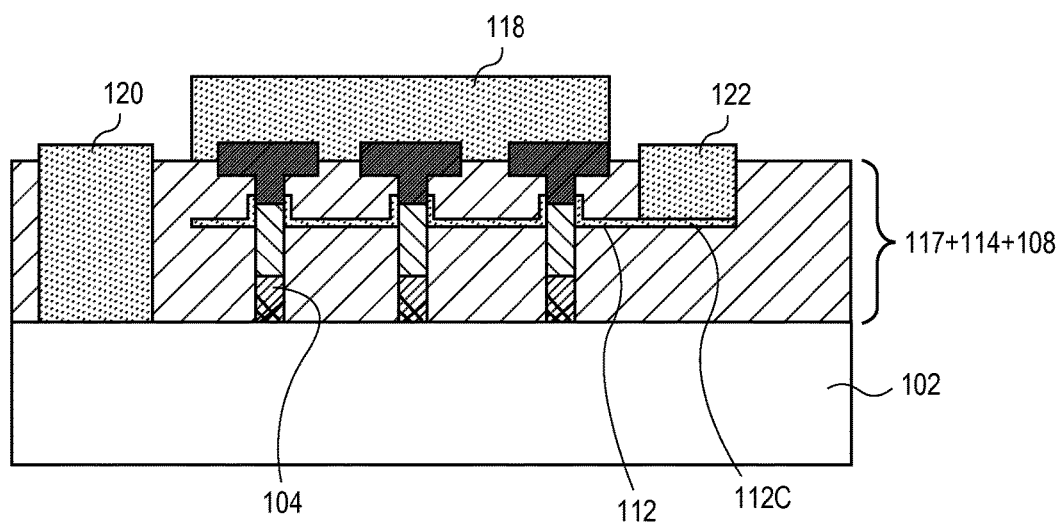

FIG. 1J illustrates a cross-sectional view of the semiconductor structure of FIG. 1I following drain contact and gate contact formation. In an embodiment, the STI structure (including the third isolation layer 117, the second isolation layer 114, and the STI layer 108) is patterned with via/contact holes to expose portions of the substrate 102 coupled to the drain region(s) 104 and to expose a portion of the gate stack 112 (e.g., the portion 112C described in association with FIG. 1E). A drain contact 120 and a gate contact 122 may then be fabricated by a metal deposition and planarization process or by a selective growth process. In either case, in one embodiment, the material of the drain contact 120 and the gate contact 122 is substantially the same as the material of the source contact 118. Although, in other embodiments, the material of the drain contact 120 and the gate contact 122 is different from the material of the source contact 118. In an embodiment, the via/contact holes formed to expose portions of the substrate 102 coupled to the drain region 104 and to expose a portion of the gate stack 112 are fabricated using a lithography and etch process. It is to be appreciated that, as depicted, the drain contact may not be formed directly on the confined drain region, but rather on a portion of substrate 102 that is electrically coupled with drain region(s) 104.

Referring again to FIG. 1J, a semiconductor device based on a vertical channel region may be a semiconductor device incorporating a gate surrounding the channel region, and a pair of vertically oriented source/drain regions. In an embodiment, the semiconductor device is a MOS-FET. In one embodiment, the semiconductor device is a vertical MOS-FET and is an isolated device or is one device in a plurality of nested devices. It is to be appreciated that the structures resulting from the above exemplary processing scheme, e.g., the structure from FIG. 1J, may be used in a same or similar form for subsequent processing operations to complete device fabrication, such as PMOS and/or NMOS device fabrication. In such cases, opposing source and drain regions have a same conductivity type. As will be appreciated for a typical integrated circuit, both N- and P-channel transistors may be fabricated on a single substrate to form a CMOS integrated circuit. In other embodiments, a tunnel field effect transistor (TFET) is fabricated having opposing source and drain regions of opposite conductivity type. In either case, additional interconnect wiring may be fabricated in order to integrate such devices into an integrated circuit. Furthermore, it is to be appreciated that a single device may include only one, or more than one (e.g., by use of a common gate stack), of a plurality of vertical channel regions fabricated above a substrate. FIG. 1I illustrates a particular embodiment where three vertical channel regions share a common gate electrode and common source/drain regions.

It is to be appreciated that not all aspects of the processes described above need be practiced to fall within the spirit and scope of embodiments of the present invention. Also, the processes described herein may be used to fabricate one or a plurality of semiconductor devices. The semiconductor devices may be transistors or like devices. For example, in an embodiment, the semiconductor devices are metal-oxide semiconductor (MOS) transistors for logic or memory, or are bipolar transistors. Also, in an embodiment, the semiconductor devices have a three-dimensional architecture, such as a gate-all-around device. One or more embodiments may be particularly useful for fabricating semiconductor devices at a 10 nanometer (10 nm) or smaller technology node. Embodiments herein may be applicable for improving transistor layout density and for mitigating trends toward increases in contact resistance.

Figure 2:
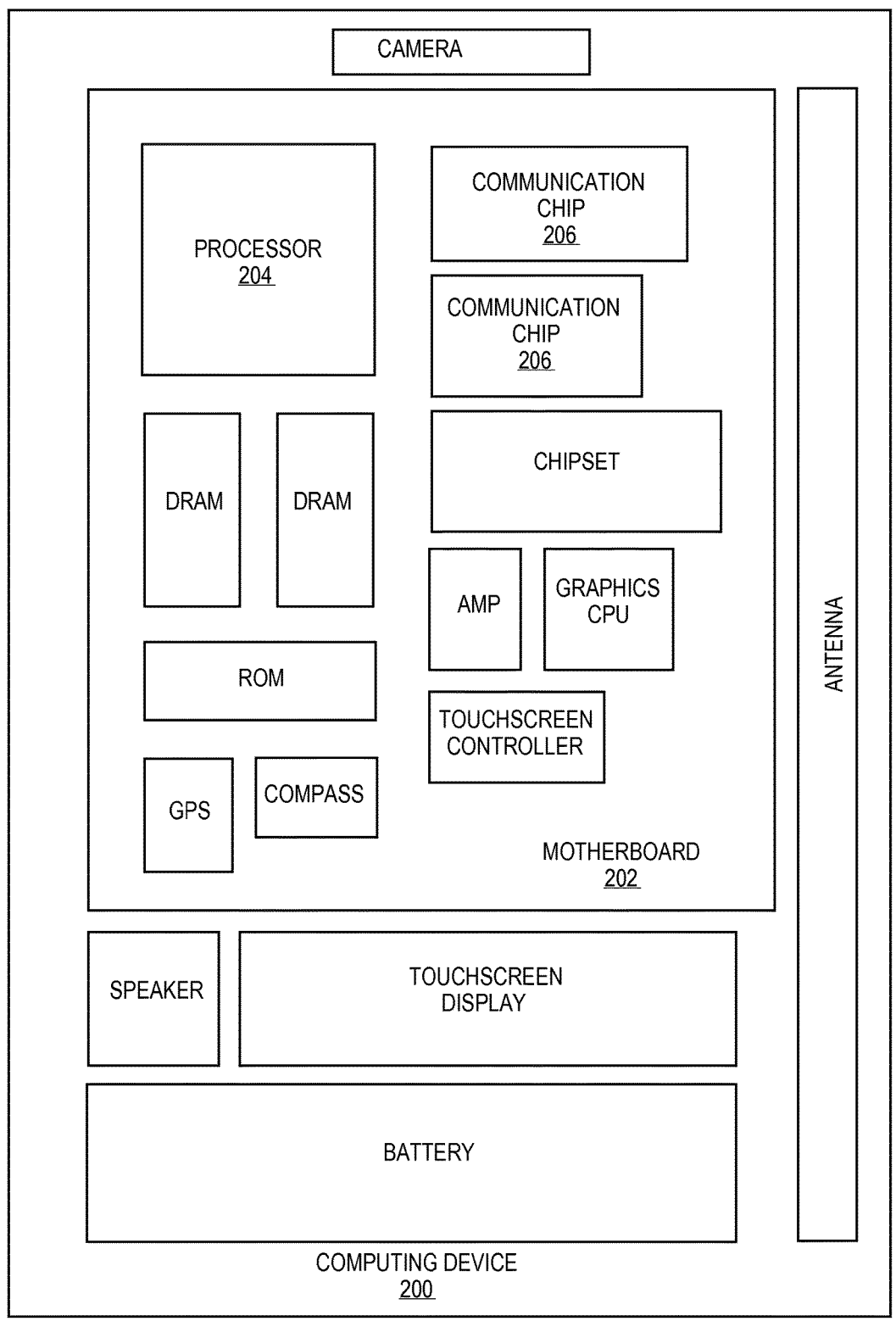
FIG. 2 illustrates a computing device in accordance with one implementation of the invention.

FIG. 2 illustrates a computing device 200 in accordance with one implementation of the invention. The computing device 200 houses a board 202. The board 202 may include a number of components, including but not limited to a processor 204 and at least one communication chip 206. The processor 204 is physically and electrically coupled to the board 202. In some implementations the at least one communication chip 206 is also physically and electrically coupled to the board 202. In further implementations, the communication chip 206 is part of the processor 204.

Depending on its applications, computing device 200 may include other components that may or may not be physically and electrically coupled to the board 202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 206 enables wireless communications for the transfer of data to and from the computing device 200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 200 may include a plurality of communication chips 206. For instance, a first communication chip 206 may be dedicated to shorter range wireless communications such as Wi-Fi and Bluetooth and a second communication chip 206 may be dedicated to longer range wireless communications such as GPS, EDGE, GPRS, CDMA, WiMAX, LTE, Ev-DO, and others.

The processor 204 of the computing device 200 includes an integrated circuit die packaged within the processor 204. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 206 also includes an integrated circuit die packaged within the communication chip 206. In accordance with another implementation of the invention, the integrated circuit die of the communication chip includes one or more devices, such as MOS-FET transistors built in accordance with implementations of the invention.

In further implementations, another component housed within the computing device 200 may contain an integrated circuit die that includes one or more devices, such as MOS-FET transistors built in accordance with implementations of the invention.

In various implementations, the computing device 200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other electronic device that processes data.

Thus, embodiments of the present invention include aspect ratio trapping (ART) approaches for fabricating vertical semiconductor devices and vertical semiconductor devices fabricated there from.

In an embodiment, a semiconductor device includes a substrate with an uppermost surface having a first lattice constant. A first source/drain region is disposed on the uppermost surface of the substrate and has a second, different, lattice constant. A vertical channel region is disposed on the first source/drain region. A second source/drain region is disposed on the vertical channel region. A gate stack is disposed on and completely surrounds a portion of the vertical channel region.

In one embodiment, the semiconductor device further includes a plurality of lattice defects confined to the first source/drain region. The vertical channel region is essentially defect-free.

In one embodiment, the first and second source/drain regions are composed of a semiconductor material different from a semiconductor material of the vertical channel region.

In one embodiment, the semiconductor material of the first and second source/drain regions is lattice mismatched from the semiconductor material of the vertical channel region, and the first and second source/drain regions impart a strain to the vertical channel region.

In one embodiment, the semiconductor device further includes a first contact disposed on the uppermost surface of the substrate and electrically coupled to the first source/drain region through the substrate. A second contact is disposed on the second source/drain region. A gate contact is disposed on a horizontal extension of the gate stack.

In one embodiment, the first source/drain region is a drain region, and the second source/drain region is a source region.

In one embodiment, the first source/drain region is a source region, and the second source/drain region is a drain region.

In one embodiment, the gate stack includes a high-k gate dielectric layer and a metal gate electrode.

In one embodiment, a conductivity type of the first source/drain region is the same as a conductivity type of the second source/drain region, and the semiconductor device is a MOS-FET device.

In one embodiment, a conductivity type of the first source/drain region is opposite to a conductivity type of the second source/drain region, and the semiconductor device is a tunnel FET device.

In an embodiment, a semiconductor device, includes a substrate having a surface. A first source/drain region is disposed on the surface of the substrate. A vertical channel region is disposed on the first source/drain region. A plurality of lattice defects is confined to the first source/drain region. The vertical channel region is essentially defect-free. A second source/drain region is disposed on the vertical channel region. A gate stack is disposed on and completely surrounds a portion of the vertical channel region.

In one embodiment, the first and second source/drain regions are composed of a semiconductor material different from a semiconductor material of the vertical channel region.

In one embodiment, the semiconductor material of the first and second source/drain regions is lattice mismatched from the semiconductor material of the vertical channel region, and the first and second source/drain regions impart a strain to the vertical channel region.

In one embodiment, the semiconductor device further includes a first contact disposed on the surface of the substrate and electrically coupled to the first source/drain region through the substrate. A second contact is disposed on the second source/drain region. A gate contact is disposed on a horizontal extension of the gate stack.

In one embodiment, the first source/drain region is a drain region, and the second source/drain region is a source region.

In one embodiment, the first source/drain region is a source region, and the second source/drain region is a drain region.

In one embodiment, the gate stack includes a high-k gate dielectric layer and a metal gate electrode.

In one embodiment, a conductivity type of the first source/drain region is the same as a conductivity type of the second source/drain region, and the semiconductor device is a MOS-FET device.

In one embodiment, a conductivity type of the first source/drain region is opposite to a conductivity type of the second source/drain region, and the semiconductor device is a tunnel FET device.

In an embodiment, a method of fabricating a semiconductor device involves forming an insulator layer on a surface of a substrate. The method also involves patterning the insulator layer to form an opening in the insulator layer, the opening exposing a portion of the surface of the substrate. The method also involves forming a first source/drain region in the opening, on the surface of the substrate. The method also involves forming a vertical channel region in the opening, on the first source/drain region. The method also involves forming a second source/drain region in the opening, on the vertical channel region. The method also involves recessing the insulator layer to expose a portion of the vertical channel region. The method also involves forming a gate stack on and completely surrounding an exposed portion of the vertical channel region.

In one embodiment, forming the first source/drain region involves forming a plurality of lattice defects confined to the first source/drain region, wherein the vertical channel region is formed essentially defect-free.

In one embodiment, forming the first source/drain region involves forming the first source/drain region having a lattice constant different than a lattice constant of the surface of the substrate.

In one embodiment, forming the second source/drain region in the opening involves forming a first portion of the second source/drain region in the opening, and forming a second portion of the second source/drain region above the opening and on a portion of an uppermost surface of the insulator layer.

In one embodiment, forming the first source/drain region involves forming a drain region, and forming the second source/drain region involves forming a source region.

In one embodiment, forming the first source/drain region involves forming a source region, and forming the second source/drain region involves forming a drain region.

What is claimed is:

1. A semiconductor device, comprising:
a substrate with an uppermost surface having a first lattice constant;
a first source/drain region disposed on the uppermost surface of the substrate and having a second, different, lattice constant;
a vertical channel region disposed on the first source/drain region;
a second source/drain region disposed on the vertical channel region, wherein the second source/drain region has an upper lateral portion and a lower vertical portion, the lower vertical portion on the vertical channel region, and the lower vertical portion having first and second sides, wherein the upper lateral portion extends beyond both the first and second sides of the lower vertical portion, and wherein the upper lateral portion has a lateral width greater than a lateral width of the vertical channel region; and
a gate stack disposed on and completely surrounding a portion of the vertical channel region, wherein the gate stack is not in physical contact with the upper lateral portion of the second source/drain region.

2. The semiconductor device of claim 1, further comprising:
a plurality of lattice defects confined to the first source/drain region, wherein the vertical channel region is essentially defect-free.

3. The semiconductor device of claim 1, wherein the first and second source/drain regions comprise a semiconductor material different from a semiconductor material of the vertical channel region.

4. The semiconductor device of claim 3, wherein the semiconductor material of the first and second source/drain regions is lattice mismatched from the semiconductor material of the vertical channel region, and wherein the first and second source/drain regions impart a strain to the vertical channel region.

5. The semiconductor device of claim 1, further comprising:
a first contact disposed on the uppermost surface of the substrate and electrically coupled to the first source/drain region through the substrate;
a second contact disposed on the second source/drain region; and
a gate contact disposed on a horizontal extension of the gate stack.

6. The semiconductor device of claim 1, wherein the first source/drain region is a drain region, and wherein the second source/drain region is a source region.

7. The semiconductor device of claim 1, wherein the first source/drain region is a source region, and wherein the second source/drain region is a drain region.

8. The semiconductor device of claim 1, wherein the gate stack comprises a high-k gate dielectric layer and a metal gate electrode.

9. The semiconductor device of claim 1, wherein a conductivity type of the first source/drain region is the same as a conductivity type of the second source/drain region, and wherein the semiconductor device is a MOS-FET device.

10. The semiconductor device of claim 1, wherein a conductivity type of the first source/drain region is opposite to a conductivity type of the second source/drain region, and wherein the semiconductor device is a tunnel FET device.

11. A semiconductor device, comprising:
a substrate having a surface;
a first source/drain region disposed on the surface of the substrate;
a vertical channel region disposed on the first source/drain region;
a plurality of lattice defects confined to the first source/drain region, wherein the vertical channel region is essentially defect-free;
a second source/drain region disposed on the vertical channel region, wherein the second source/drain region has an upper lateral portion and a lower vertical portion, the lower vertical portion on the vertical channel region, and the lower vertical portion having first and second sides, wherein the upper lateral portion extends beyond both the first and second sides of the lower vertical portion, and wherein the upper lateral portion has a lateral width greater than a lateral width of the vertical channel region; and
a gate stack disposed on and completely surrounding a portion of the vertical channel region, wherein the gate stack is not in physical contact with the upper lateral portion of the second source/drain region.

12. The semiconductor device of claim 11, wherein the first and second source/drain regions comprise a semiconductor material different from a semiconductor material of the vertical channel region.

13. The semiconductor device of claim 12, wherein the semiconductor material of the first and second source/drain regions is lattice mismatched from the semiconductor material of the vertical channel region, and wherein the first and second source/drain regions impart a strain to the vertical channel region.

14. The semiconductor device of claim 11, further comprising:
a first contact disposed on the surface of the substrate and electrically coupled to the first source/drain region through the substrate;
a second contact disposed on the second source/drain region; and a gate contact disposed on a horizontal extension of the gate stack.

15. The semiconductor device of claim 11, wherein the first source/drain region is a drain region, and wherein the second source/drain region is a source region.

16. The semiconductor device of claim 11, wherein the first source/drain region is a source region, and wherein the second source/drain region is a drain region.

17. The semiconductor device of claim 11, wherein the gate stack comprises a high-k gate dielectric layer and a metal gate electrode.

18. The semiconductor device of claim 11, wherein a conductivity type of the first source/drain region is the same as a conductivity type of the second source/drain region, and wherein the semiconductor device is a MOS-FET device.

19. The semiconductor device of claim 11, wherein a conductivity type of the first source/drain region is opposite to a conductivity type of the second source/drain region, and wherein the semiconductor device is a tunnel FET device.

20. A method of fabricating a semiconductor device, the method comprising:
forming an insulator layer on a surface of a substrate;
patterning the insulator layer to form an opening in the insulator layer, the opening exposing a portion of the surface of the substrate;
forming a first source/drain region in the opening, on the surface of the substrate;
forming a vertical channel region in the opening, on the first source/drain region;
forming a second source/drain region in the opening, on the vertical channel region, wherein the second source/drain region has an upper lateral portion and a lower vertical portion, the lower vertical portion on the vertical channel region, and the lower vertical portion having first and second sides, wherein the upper lateral portion extends beyond both the first and second sides of the lower vertical portion, and wherein the upper lateral portion has a lateral width greater than a lateral width of the vertical channel region;
recessing the insulator layer to expose a portion of the vertical channel region; and
forming a gate stack on and completely surrounding an exposed portion of the vertical channel region, wherein the gate stack is not in physical contact with the upper lateral portion of the second source/drain region.

21. The method of claim 20, wherein forming the first source/drain region comprises forming a plurality of lattice defects confined to the first source/drain region, wherein the vertical channel region is formed essentially defect-free.

22. The method of claim 20, wherein forming the first source/drain region comprises forming the first source/drain region having a lattice constant different than a lattice constant of the surface of the substrate.

23. The method of claim 20, wherein forming the second source/drain region in the opening comprises forming a first portion of the second source/drain region in the opening, and forming a second portion of the second source/drain region above the opening and on a portion of an uppermost surface of the insulator layer.

24. The method of claim 20, wherein forming the first source/drain region comprises forming a drain region, and wherein forming the second source/drain region comprises forming a source region.

25. The method of claim 20, wherein forming the first source/drain region comprises forming a source region, and wherein forming the second source/drain region comprises forming a drain region.

\* \* \* \* \*